United States Patent [19]
Morton

[11] Patent Number: 5,159,572
[45] Date of Patent: Oct. 27, 1992

[54] DRAM ARCHITECTURE HAVING DISTRIBUTED ADDRESS DECODING AND TIMING CONTROL

[75] Inventor: Bruce L. Morton, Round Rock, Tex.

[73] Assignee: Motorola, Inc., Schaumburg, Ill.

[21] Appl. No.: 632,695

[22] Filed: Dec. 24, 1990

[51] Int. Cl.$^5$ .............................................. G11C 8/00
[52] U.S. Cl. ........................ 365/230.06; 365/230.03; 365/233
[58] Field of Search ...................... 365/230.03, 230.06, 365/233

[56] References Cited

U.S. PATENT DOCUMENTS

| | | | |
|---|---|---|---|
| 3,969,706 | 7/1976 | Proebsting et al. | 365/233 |
| 4,569,036 | 2/1986 | Fujii et al. | 365/230.03 |
| 4,833,656 | 5/1989 | Tobita | 365/230.06 |
| 5,043,947 | 8/1991 | Oshima et al. | 365/230.03 |
| 5,119,334 | 6/1992 | Fujii | 365/230.06 |

FOREIGN PATENT DOCUMENTS 0142376 5/1985 European Pat. Off. ........ 365/230.06

Primary Examiner—Eugene R. Laroche
Assistant Examiner—Tan Nguyen
Attorney, Agent, or Firm—Robert L. King

[57] ABSTRACT

A DRAM has both a distributed row address decode and a distributed timing control to generate required timing signals. A level of decoding is implemented within each of local row decoders to generate critical timing signals for each of a plurality of DRAM bit cell arrays. Word line signals from an output of each of the local row decoders are interleaved. The interleaved word line signals permit a high density DRAM semiconductor manufacturing process to utilize a differing pitch for each of a plurality of levels of interconnect. A first level of interconnect has a pitch which is significantly smaller than the pitch of a second interconnect level positioned above the first level of interconnect.

11 Claims, 3 Drawing Sheets

DRAM ARCHITECTURE HAVING DISTRIBUTED ADDRESS DECODING AND TIMING CONTROL

FIELD OF THE INVENTION

This invention relates to memory architectures, and in particular, to a DRAM architecture.

BACKGROUND OF THE INVENTION

The number of memory elements or bits contained within a DRAM has been increasing and will continue to steadily increase with each incremental improvement in both the process manufacturing and the design. As the number of memory bits increases, the need to increase the bit density increases in order to minimize both die area of the DRAM and memory bit access time. A common method of increasing bit density in a DRAM is to reduce the transistor dimensions of both the memory bit and the associated control logic, and to reduce the interconnect dimensions. Reductions in process dimensions are generally accomplished by improvements in both semiconductor process manufacturing and semiconductor mask generating techniques. Another common method of increasing the density of the memory bits within a DRAM is through the use of a vertical process manufacturing technique, or vertical integration. Two common cell structures which use vertical integration techniques are a stacked-capacitor cell and a trench-capacitor cell. These two cell structures allow a charge storage device within a DRAM memory bit cell to occupy the least amount of planar area possible, thus providing a high density of memory bits. Vertical integration techniques allow the capacitance of the charge storage device, which is critical for maintaining a logic state dynamically, to be maintained and scaled proportionately with the decrease in processing dimensions. Processing improvements as described above are only one area in which DRAM technology has been improved. In order to fully utilize the improvements in processing, improvements in design techniques, such as DRAM architectures, have also occurred.

Existing DRAM architectures typically feature memory arrays evenly distributed around a centrally located control logic. The centrally located control logic generates critical timing control signals that selectively activate a predetermined portion of the memory for the purpose of reading and writing data to a predetermined memory location. A primary problem with this architecture is an inherent time delay of the critical timing control signals which need to be routed a significant distance from the centrally located control logic to the furthest removed memory cells. The problem associated with having a centrally located control logic is a problem associated with the critical timing control signals being skewed from one another throughout the different portions of the die. Some of the effects of having the critical timing signals skewed throughout the different portions of the die include, but are not limited to, causing word line drivers to malfunction when accessing a row of DRAM bit cells within the DRAM array, and producing control signals at a point in time which biases transistors in a destructive manner. In general, these effects resulting from the memory architecture reduce the overall performance and reliability of a DRAM circuit.

SUMMARY OF THE INVENTION

The previously mentioned needs are fulfilled with the present invention. In one form, a DRAM and method is provided having an architecture with both distributed decoding and timing control. A plurality of sections of memory cell arrays are coupled to form a plurality of array columns and rows. Each memory cell array comprises a plurality of columns and rows of DRAM cells. A first means is positioned adjacent to the sections of memory cell arrays. The first means receives both an address input and a timing control signal. The first means provides both a first partial decode signal and a second signal having both decoding and timing control information. The first partial decode and second signals address a predetermined section of memory cell arrays at a predetermined time. A second means is coupled to each memory cell array for receiving both the first partial decode signal and the second signal. The second means further decodes the first partial decode signal and second signal to provide a select signal to activate a predetermined row of DRAM cells within at least one of the arrays. The second signal to generate critical timing to accurately control when the predetermined row of DRAM cells is activated regardless of inherent clock skew associated with the timing control signal. These and other features, and advantages, will be more clearly understood from the following detailed description taken in conjunction with the accompanying drawings.

DESCRIPTION OF A PREFERRED EMBODIMENT

Figure 1:
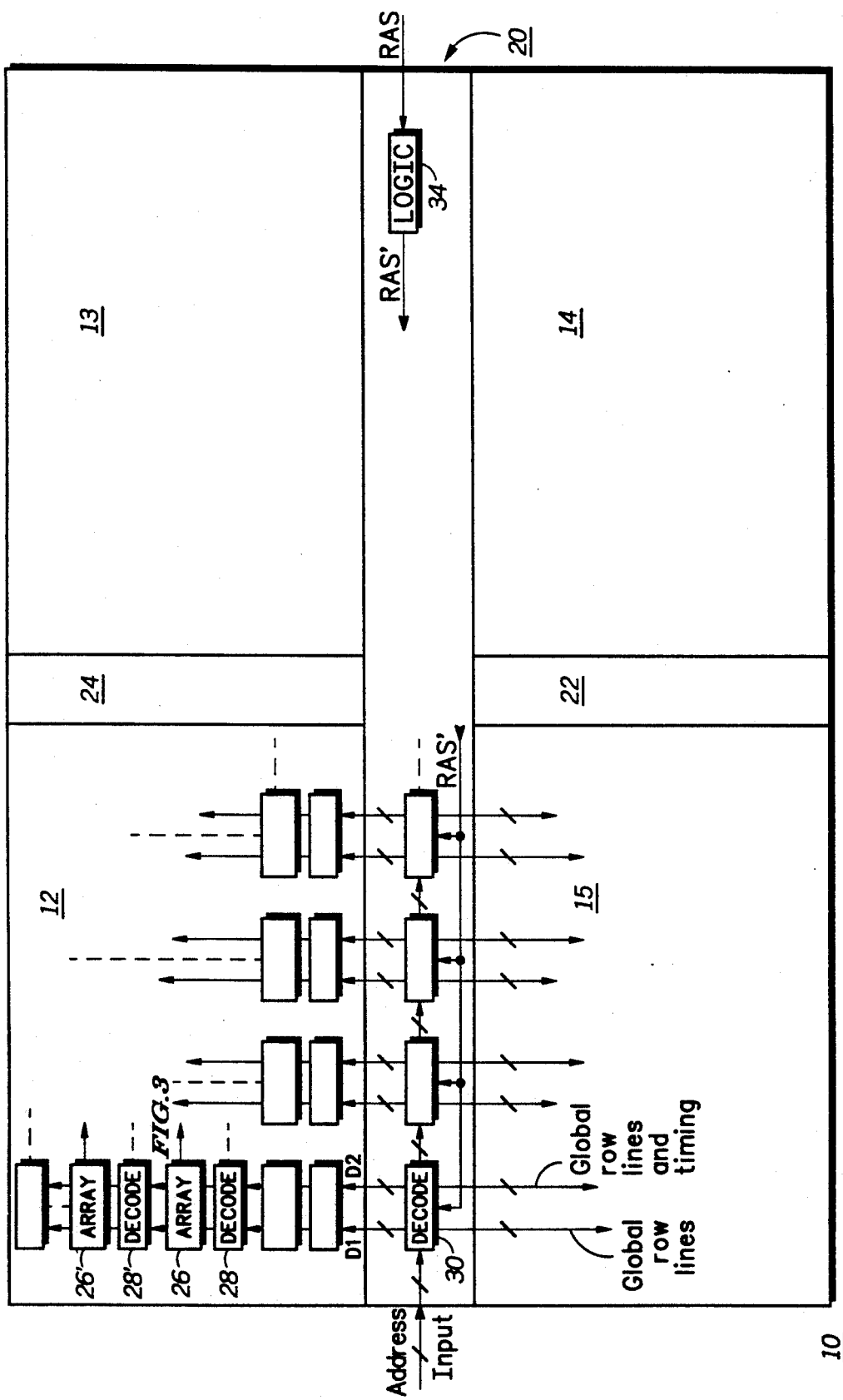
FIG. 1 illustrates in block diagram form a DRAM architecture in accordance with the present invention.

Illustrated in FIG. 1 is a DRAM 10 having four partitions or data bit quadrants 12, 13, 14 and 15, a global address decoder and timing control logic portion 20, and global column decoder logic blocks 22 and 24. Each of the four data bit quadrants 12-15 has a predetermined number of DRAM cell arrays, such as DRAM cell arrays 26 and 26', and a predetermined number of local decoders such as local decoder portions 28 and 28'. The global address decoder and timing control logic portion 20 contains a predetermined number of global row address decoders, such as a global row address decoder 30, and a global timing control logic 34.

The global address decoder and timing control logic portion 20 has a first input to receive an address input labeled "Address Input", and a second input to receive a timing control signal labeled "row address strobe" or "RAS" which is further connected to an input of the global timing control logic 34. The global timing control logic 34 has an output to provide a timing control signal labeled "RAS'."

Each of the global row address decoders, such as 30, has a first input to receive the address input signal and a second input that is connected to the output of the global timing control logic 34 to receive the timing control signal RAS'. Each global row address decoder has a first output, such as D1 of decoder 30, containing a predetermined number of global row address signals labeled "Global Row Lines" connected to two adjacent quadrants, such as quadrants 12 and 15. Each global row address decoder also has a second output, such as D2 of decoder 30, containing a predetermined number of global row address signals and a timing control signal called "RAS'" (not labeled in FIG. 1), collectively labeled "Global row lines and timing" and also connected to each of two adjacent quadrants, such as quadrants 12 and 15. It should be apparent that although the global address decoders are illustrated in FIG. 1 as providing decoding and timing signals D1 and D2 to two sections within the memory, each decoder may be configured to provide the signals to only a single quadrant or to more than two quadrants.

Within each quadrant, each of the local row decoder portions, such as 28, has a first input to receive the first output of a predetermined global row address decoder, such as 30, and a second input to receive the second output of the global row address decoder, such as 30.

The global column decoder logic blocks 22 and 24 of FIG. 1 each contain conventional decode logic (not illustrated) and amplifiers (not illustrated) for decoding and amplifying a predetermined column output signal. The global column decoder logic blocks 22 and 24 each has one of a plurality of first inputs (not illustrated) connected to a predetermined one of a plurality of outputs (not illustrated) of each of the data bit quadrants 12-15 to receive column data information, and one of a plurality of second inputs (not illustrated) connected to one of a plurality of outputs (not illustrated) of the global address decoder and timing logic portion 20 to receive address inputs and timing control in a conventional manner.

In operation, the primary critical timing chains utilized within DRAM circuit 10 are a RAS timing chain and a "column address strobe" (CAS) timing chain (not illustrated). The present invention pertains primarily to the critical RAS timing chain and the resulting architecture of DRAM circuit 10. The CAS timing chain and the column decode logic blocks 22 and 24 are only referenced herein to provide a better understanding of the entire DRAM operation.

Figure 2:
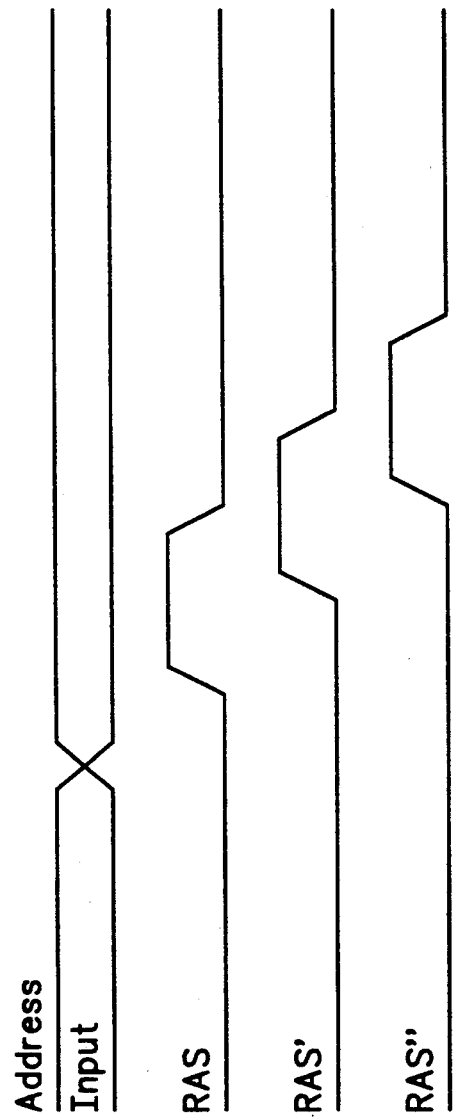
FIG. 2 illustrates in timing diagram form control timing associated with the DRAM of FIG. 1.

A timing diagram in FIG. 2 illustrates timing signals needed to control the operation of DRAM 10 of FIG. 1. As illustrated in FIG. 2, the address input connected to each global row address decoder, such as 30, of FIG. 1 is selectively decoded by a predetermined global row address decoder, such as decoder 30. Additionally, the global timing control logic 34 generates the timing control signal RAS' in response to the timing control signal RAS. The timing control signal RAS', which is connected to each global row address decoder activates the selectively decoded row address decoder 30. The first and second outputs of the selectively decoded row address decoder 30, which are connected to a predetermined one of local row decoder portions, such as 28, are further decoded in response to timing control signal RAS".

Figure 3:
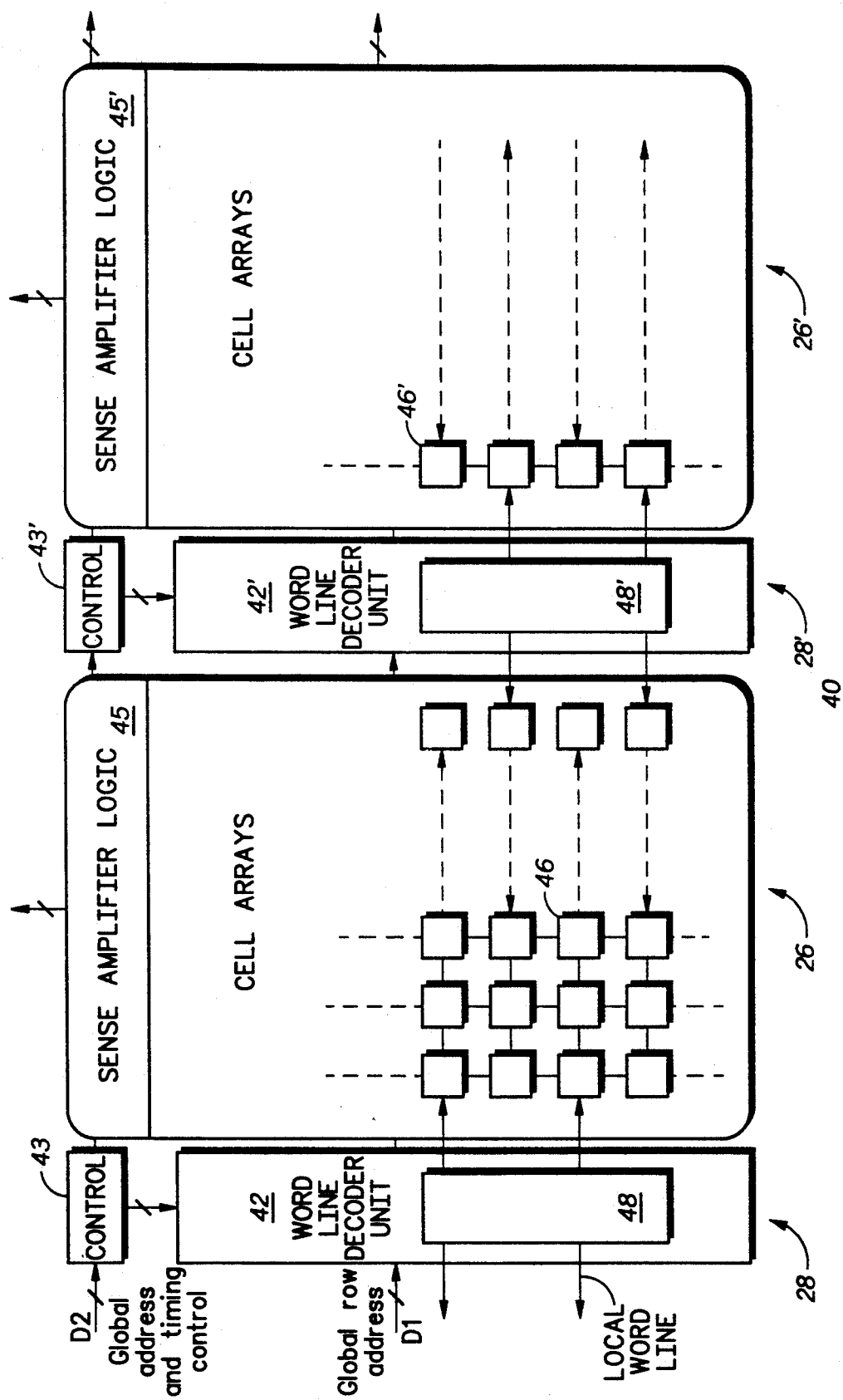
FIG. 3 illustrates in block diagram form a section of the DRAM of FIG. 1.

Illustrated in FIG. 3 is a section 40 of DRAM 10 of FIG. 1. Section 40 is a detailed view of the DRAM cell arrays 26 and 26', the local row decoder portions 28 and 28', and the respective interconnections. Each of the DRAM cell arrays 26 and 26' has a column data sense amplifier logic 45 and 45', respectively, and each has an array of DRAM bit cells, such as bit cells 46 and 46', respectively. Each of the local row decoder portions 28 and 28' has a word line decoder unit 42 and 42', respectively, and control logic 43 and 43', respectively. Each of decoder units 42, 42' contains a predetermined number of word line decoder-drivers such as decoder-drivers 48 and 48', respectively. Also, each of the local row decoder portions 28 and 28' has a local row address-timing control logic 43 and 43', respectively.

Each of the word line decoder units 42 and 42' has a first input to receive the first output of a predetermined global row address decoder 30 of FIG. 1, and each has a second input to receive a control output of the local row address-timing control logic 43 and 43', respectively. Each of the local row address-timing control logic 43 and 43' has an input connected to the second output of the predetermined global row address decoder 30 of FIG. 1.

Each of the DRAM cell arrays 26 and 26' of FIG. 3 comprises a predetermined number of DRAM bit cells 46 and 46', respectively. Each individual row of DRAM bit cells shares a common control word line output from a predetermined word line decoder-driver 48 and 48'. DRAM bit cells of each individual column share a common output that is connected together and to one of a plurality of inputs (not shown) of one of the column data sense amplifier logic 45 or 45'. The column data sense amplifier logic 45 and 45' each has a plurality of outputs that are connected to the first inputs (not shown) of the column decode and sense amplifier logic blocks 22 and 24 of FIG. 1.

Both FIG. 1 and FIG. 3 illustrate the physical placement of the DRAM cell arrays 26, 26' with respect to the local row decoder portions 28, 28'. The DRAM cell array 26 is placed between two local row decoder portions 28 and 28'. The local row decoder portions are placed along two opposite outside edges of each quadrant so that each cell array, such as 26, has decoders, such as 28 and 28', on each of two opposing sides (left and right sides as illustrated in FIG. 3). FIG. 3 illustrates the interleaved fashion in which the individual word line outputs from each of the word line decoder-drivers 48 and 48' are routed through the array of DRAM bit cells 46 and 46', respectively. In other words, in array 26 decoder-drivers 48 and 48' drive alternating rows. Each output of each of the word line decoder-drivers 48 and 48' connects to a word line of two adjacent DRAM cell arrays 26 and 26', and each adjacent word line within each DRAM cell array 26 and 26' is connected to word line decoder-drivers 48 and 48' in an alternating fashion. In general, no two adjacent word lines are connected to the same word line decoder-driver 48 and 48'.

In operation, DRAM 10 has distributed decoding and timing control. The two outputs from the global row address decoder 30 of FIG. 1 function as a first level of decoding and are decoded by a predetermined row address decoder portion such as 28 as illustrated in FIG. 1 and FIG. 3. The local row address-timing control logic 43 and 43' of FIG. 3 buffers the second output of the global row address decoder 30 of FIG. 1. Since the second output of the global row address decoder 30 of FIG. 1 contains the timing control signal RAS", the output of the local row address-timing control logic 43 and 43' of FIG. 3 provides the timing control function as well as a second level of decode signals for the word line decoder-drivers such as 48 and 48', respectively. The word line decoder-drivers such as 48 and 48' decode the first output of the global row address decoder 30 of FIG. 1, as well as the second level decode signals respectively from the local row address-timing control logic 43 and 43' to generate a local word line signal that has critical timing associated therewith. Since each of the local row decoder portions such as 28 are distributed througout each quadrant of DRAM arrays 12-15, each of the local row decoder portions such as 28 will receive the global row address and global address and timing control signals, from the outputs of the global row address decoders 30 of FIG. 1, at times skewed from one another. But since each of the local row decoder portions such as 28 receives the timing control signal RAS" as well as global address signals, and since the timing control signal RAS" controls the generation of the critical word line signal for each of the DRAM cell arrays, the effects of having the timing signal RAS and its derivatives skewed from one another at various portions of the DRAM die are eliminated.

The second level of decoding mentioned above and embodied within the local row decoder portions such as 28 and 28' of FIG. 3, along with the interleaved routing method of the local word lines, as discussed above, allow for a first or low level of interconnect that provides connections from a predetermined output of each of the local row decoder portions such as 28 and 28' to a predetermined row of DRAM bit cells such as 46 and 46', respectively, to have a physical dimension significantly smaller than the global row address interconnect signals. The local row decoder portions 28 and 28' are each built in a pitch of four DRAM bit cells. In other words, referring to FIG. 3 word line decoder-driver 48 has a length which is equivalent to four rows of bit cells. The illustrated pitch allows the global row address signals and global address and timing control signals to each have a pitch approximately four times that of the lower level interconnect. Because the Global address lines or conductors may be made larger than required for the local word line widths, the resistance of the Global address lines is minimized which also minimizes signal delays associated with the transmission of address signals through the memory. The Global address lines are associated with a higher level of interconnect because these address lines are physically positioned above the local word lines or at a higher physical level. The increase in pitch of the higher level of interconnect permits the semiconductor manufacturing process to be less expensive and more reliable. The significantly smaller physical dimension of the lower level interconnect allows for a high density of DRAM bit cells within a DRAM cell array without requiring the global row address interconnect lines to also be significantly smaller. This feature of DRAM 10 is additionally significant when the semiconductor manufacturing process utilizes a vertical integration process for the manufacturing of the DRAM bit cells to gain a higher density. A primary reason why this statement is true is that the vertical integration manufacturing process results in an increased vertical dimension between a lower level of interconnect, where the local row decoder portions 28 and 28' as well as the DRAM bit cells are manufactured, and the higher level interconnect where signals are routed. Since a primary difficulty in semiconductor manufacturing is making a contact between interconnect levels having an increase in the vertical dimension, this contact problem can be significantly reduced by having the higher level of interconnect physically larger than the lower level of interconnect. The combination of having a second level of decode within the local row decoder portions 28 and 28' along with an interleaved word line routing allows the semiconductor manufacturing to be less expensive and more reliable.

By now it should be apparent that there has been provided a DRAM having a combination of architectural features. These features includes having both the local row decoders and the critical timing control logic distributed throughout the array of DRAM cells. Each of the local row decoders has a second level of row address decoding, and the local word line signal outputs of each local row decoder are interleaved. The combination of these architectural features permits the semiconductor manufacturing of a high density DRAM circuit that has both an improved reliability and a lower manufacturing cost.

While there have been described herein the principles of the invention, it is to be clearly understood to those skilled in the art that this description is made only by way of example and not as a limitation to the scope of the invention. For example, the described four DRAM array quadrants could be increased or decreased either in size or number. The distribution of both the decode logic and critical timing control logic to reduce the skewing effects of the RAS control signal could also be applied to the CAS control signal or any other critical timing signals within the DRAM circuit. The logic sense of the RAS timing control signal could be implemented using negative logic. The number of encoders and decoders for the address input signal as taught herein can be varied as needed. Accordingly, it is intended, by the appended claims, to cover all modifications of the invention which fall within the true spirit and scope of the invention.

I claim:

1. A DRAM architecture having distributed address decoding and timing control, comprising;
   a plurality of sections of memory cell arrays forming a plurality of array columns and rows, each memory cell array comprising a plurality of columns and rows of DRAM cells;
   first means positioned adjacent to the sections of memory cell arrays, the first means receiving both an address input and a timing control signal, the first means providing both a partial decode signal and a second signal having both decoding and timing control information, the partial decode and second signals addressing a predetermined section of memory cell arrays at a predetermined time; and
   second means coupled to each memory cell array for receiving both the partial decode signal and the second signal, the second means further decoding the partial decode signal and second signal to provide a select signal to activate a predetermined row of DRAM cells within at least one of the arrays while using the second signal to generate critical timing to accurately control when the predetermined row of DRAM cells is activated regardless of inherent clock skew associated with the timing control signal.

2. The DRAM architecture of claim 1 wherein the second means further comprise:
   a plurality of decoder circuits, each decoder circuit receiving the partial decode signal and the second signal, a predetermined number of the decoder circuits being coupled to two memory cell arrays for selectively providing the select signal to either one of the two memory cell arrays.

3. The DRAM architecture of claim 2 wherein each decoder circuit of the second means is coupled to alternating rows of DRAM cells of a predetermined memory cell array.

4. The DRAM architecture of claim 2 further comprising a first plurality of interconnect conductors for coupling the first partial decode signal and the second signal to the second means, and a second plurality of interconnect conductors for coupling the select signal to the DRAM cells and for coupling the DRAM cells, said first plurality of interconnect conductors having a width which is substantially larger than a width of the second plurality of interconnect conductors.

5. The DRAM architecture of claim 2 wherein each decoder circuit has a length dimension which is an integer multiple larger than a length of an area required to implement a row of the DRAM cells.

6. The DRAM architecture of claim 5 wherein the integer multiple is an even integer multiple.

7. A method of distributing address decoding and timing control in a DRAM, comprising the steps of:

forming a plurality of columns and rows of memory cell arrays within each of a plurality of sections of memory cell arrays, each memory cell array having a plurality of columns and rows of DRAM cells;

positioning first means adjacent each of the sections of memory cell arrays, the first means receiving both an address input and a timing control signal, the first means providing both a partial decode signal and a second signal having both decoding and timing control information, the partial decode and second signals addressing a predetermined section of memory cell arrays at a predetermined time; and coupling second means to each memory cell array for receiving both the partial decode signal and the second signal, the second means further decoding the partial decode signal and second signal to provide a select signal to activate a predetermined row of DRAM cells within at least one of the arrays while using the second signal to generate critical timing to accurately control when the predetermined row of DRAM cells is activated regardless of inherent clock skew associated with the timing control signal.

8. The method of claim 7 wherein the step of coupling said second means further comprises the steps of:

providing a plurality of decoder circuits, each decoder circuit receiving the partial decode signal and the second signal; and coupling a predetermined number of the decoder circuits to two memory cell arrays for selectively providing the select signal to either one of the two memory cell arrays.

9. The method of claim 8 wherein the step of coupling a predetermined number of the decoder circuits to two memory cell arrays further comprises the steps of:

coupling the first partial decode signal and the second signal via a first plurality of interconnect conductors;

coupling the DRAM cells and the select signal to the DRAM cells via a second plurality of interconnect conductors; and forming said first plurality of interconnect conductors having a width which is substantially larger than a width of the second plurality of interconnect conductors.

10. A DRAM architecture having distributed address decoding and timing control, comprising;

an even integer number of sections of memory cell arrays forming a plurality of array columns and rows, each memory cell array comprising a plurality of columns and rows of DRAM cells;

global decoding means positioned adjacent to the sections of memory cell arrays, the global decoding means receiving both an address input and a timing control signal, the global decoding means providing both a partial decode signal and a second signal having both decoding and timing control information, the partial decode and second signals addressing a predetermined section of memory cell arrays at a predetermined time; and local decoding means comprising a plurality of local decoder circuits positioned adjacent to each memory cell array for receiving both the partial decode signal and the second signal, the local decoding means further decoding the partial decode signal and second signal to provide a select signal to activate a predetermined row of DRAM cells within at least one of the arrays while using the second signal to generate critical timing to accurately control when the predetermined row of DRAM cells is activated regardless of inherent clock skew associated with the timing control signal.

11. The DRAM architecture of claim 10 wherein each local decoder circuit of the local decoding means is coupled to alternating rows of DRAM cells of a predetermined memory cell array in an interleaved manner.

* * * * *